United States Patent
Lee et al.

(10) Patent No.: US 7,479,816 B2
(45) Date of Patent: Jan. 20, 2009

(54) GENERATING MULTIPLE DELAYED SIGNALS OF DIFFERENT PHASES FROM A REFERENCE SIGNAL USING DELAY LOCKED LOOP (DLL)

(75) Inventors: Chun Chieh Lee, Ann Arbor (IN); Ramesh Kumar Singh, Bangalore (IN); Visvesvaraya A Pentakota, Bangalore (IN); Abhaya Kumar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/163,319

(22) Filed: Oct. 14, 2005

(65) Prior Publication Data
US 2007/0085580 A1    Apr. 19, 2007

(51) Int. Cl.
*H03L 7/06* (2006.01)
(52) U.S. Cl. .................. 327/158; 327/149
(58) Field of Classification Search .......... 327/149, 327/153, 158, 161, 163; 331/1 A, 17, 25, 331/DIG. 2; 375/373–376
See application file for complete search history.

(56) References Cited

U.S. PATENT DOCUMENTS 4,922,141 A * 5/1990 Lofgren et al. ............. 327/158
2004/0210790 A1* 10/2004 Moon et al. ................ 713/500
2006/0045222 A1* 3/2006 Kim et al. .................. 375/354
2006/0193419 A1* 8/2006 Maneatis et al. ............ 375/376

OTHER PUBLICATIONS

David J. Foley and Michael P. Flynn, "CMOSDLL-Based2-V3.2-psJitter1-GHzClock Synthesizer and Temperature-Compensated Tunable Oscillator", IEEE Journal of Solid-State Circuits, vol. 36, No. 3, pp. 417-423, Mar. 2001.

* cited by examiner

*Primary Examiner*—Lincoln Donovan
*Assistant Examiner*—Thomas J Hiltunen
(74) *Attorney, Agent, or Firm*—Warren J. Franz; Frederick J. Telecky, Jr.; Wade J. Brady, III

(57) ABSTRACT

A delay locked loop (DLL) circuit in which situations of lock to multiple periods of a reference signal is determined by a lock detector using dummy delay elements and a duty cycle correction circuit (DCC). The lock detector, the dummy delay elements and the delay control circuit are used in a path parallel to the delay elements which generate the desired delayed signals having different delays in relation to the reference signal. Due to the use of the parallel path, the throughput performance of the DLL circuit is not impeded. In an embodiment, separate charge pumps are used by a phase comparator and the lock detector used in the parallel path.

14 Claims, 4 Drawing Sheets

GENERATING MULTIPLE DELAYED SIGNALS OF DIFFERENT PHASES FROM A REFERENCE SIGNAL USING DELAY LOCKED LOOP (DLL)

BACKGROUND

1. Field of the Invention

The present invention relates to integrated circuit design, and more specifically to a method and apparatus for generating multiple delayed signals of different phases from a reference signal using DLLs.

2. Related Art

There is often a need to generate multiple delayed signals of different phases from a reference signal. For example, in analog to digital converters (ADCs), there is often a need to generate a sampling signal and a hold signal, which have some overlapping logic low level and yet have non-overlapping logic high level, and the timings of the edges for the corresponding signals may be derived from the edges of the delayed signals.

Delay locked loop (DLL) is often used to generate such delayed signals of different phases from a reference clock signal as described with the example circuit of FIG. 1. There is shown DLL 100 containing delay elements 110A-110X, phase detector 130, charge pump 140, and capacitor 160. Each component is described in further detail below.

Delay elements 110A-110X are connected in series, and each element generally offers equal delay. The magnitude of the delay is determined by the voltage level on path 161. A reference clock signal of clock period (T) is received on path 101, and the signal is ideally delayed by a magnitude equaling (T/X) by each delay element. Thus, the output of the Nth delay element is delayed by a factor of (N*T/X). Accordingly, the output of the last delay element and the reference signal should ideally have the same phase and frequency, and the corresponding propagated edges should be with a time difference of T only, as depicted in FIG. 2.

FIG. 2 is a timing diagram illustrating the operation of a DLL circuit assuming there are only three delay elements. The reference clock signal, the first delayed clock signal (i.e., output of the first delay element, e.g., 110A), the second delayed clock signal and the third delayed clock signal are respectively shown as signals 101, 220, 230 and 113. As shown by the corresponding rising edges, signals 220, 230 and 113 respectively lag reference signal 101 by ⅓ time period, ⅔ time period and ³⁄₃ time period (T). The manner in which the remaining elements of DLL circuit of FIG. 1 operate to control the delay elements, to provide at least some of such features, is described below in further detail.

Continuing with reference to FIG. 1 again, phase detector 130 compares the phases of reference clock signal 101 on one input and final delayed signal 113, and controls charge pump 140 to either charge or discharge capacitor 160 depending on the comparison result. For example, capacitor 160 may be charged more if final delayed signal 113 is deemed to lag reference signal 101, and discharged if reference signal 101 is deemed to lag final delayed signal 113.

The voltage across capacitor 160 controls the amount of delay caused by each of the delay elements 110A-110X. In one embodiment, an increase in the voltage/charge increases the magnitude of the delay. Thus, due to the operation of phase detector 130, the rising edges of signals 101 and 113 are synchronized in the steady state.

One problem with the above approach is that the rising edges may be synchronized to multiples of time period T since phase detector 130 may not recognize if the rising edges are off by more than 1.5 T (in general). Such a problem is addressed by another prior embodiment described below with reference to FIG. 3.

FIG. 3 is a circuit diagram illustrating the details of another prior DLL circuit generating multiple delayed signals of different phases from a reference signal. For conciseness, only the changes in relation to the circuit diagram of FIG. 1 are shown. Also, the circuit is described in further detail in a paper entitled, "CMOS DLL-based 2-V 3.2 ps Jitter 1-GHz Clock Synthesizer and Temperature-Compensated Tunable Oscillator" by Foley et al, and published in IEEE Journal of Solid State Circuits, Vol. 36, No. 3, March 2001 (Hereafter "Foley").

DLL circuit 300 of FIG. 3 is shown containing delay elements 110A-110X, phase detector 330, charge pump 140, lock detector 350, and capacitor 160. Lock detector 350 generally indicates situations in which the aggregate delay of the delay elements exceeds a pre-specified upper threshold or falls below a pre-specified lower threshold. Comparison with upper thresholds avoids the delayed signals locking to multiples of the time period of the reference signal. Comparison with lower threshold ensures that attempts to (erroneously) lock towards 0 phase delay is avoided.

Thus, lock detector 350 examines the outputs of delay elements 110A-110X, and generates signals indicating false locks (i.e., time period is of signals 101 and 113 is a multiple of an integer greater than or equal to 2). Accordingly, phase detector 330 continues with adjusting the phase until lock detector 350 does not indicate false locks and the rising edges of signals 101 and 113 are synchronized.

One limitation of the circuit of FIG. 3 is that the input reference signal 101 needs to have a duty cycle (Ton/T, wherein Ton represents the duration of logic high and T represents the time period) of at least approximately 50% since otherwise challenges may be presented in recognizing the conditions (noted above) sought to be detected.

FIG. 4 depicts another prior embodiment which overcomes such a disadvantage of FIG. 3. Again, for conciseness, the differences in relation to FIG. 3 only are shown. DLL circuit 400 is shown containing delay elements 110A-110X, duty cycle correction circuit (DCC) 420, phase detector 330, charge pump 140, lock detector 350, and capacitor 160.

DCC 420 operates to generate a modified reference signal having a duty cycle of 50% from reference signal 401if the duty cycle is not equal to 50%. Such modified reference signal is provided on path 101 to both phase detector 330 and delay element 110A. DCC 420 is implemented using well-known approaches.

One problem with the approach of FIG. 4 is that additional delay is introduced in the signal path, thereby causing output of delay element 110A to have (T/X+Tdcc), wherein T/X is described above and Tdcc represents the delay of DCC 420. Such additional delay (Tdcc) may be undesirable in several environments (particularly requiring high throughput performance). In addition, any jitter in DCC 420 adds to the signal path.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

A delay lock loop (DLL) circuit provided according to an aspect of the present invention contains two loops, with a first loop (including the delay elements generating the desired delayed signals from a reference signal) controlling the delays caused by the delay elements to ensure that the edges of the reference signal and the output of the last delay element are synchronized. The second loop also controls the delay elements to avoid situations of lock for multiple (e.g., 2 times or 3 times) time periods of the reference signal.

By using such separate control loops, the throughput of the first loop is not affected by the objectives sought to be attained by the second loop. Since the signal path is in the first loop, the throughput performance of the overall circuit may not be impeded.

In an embodiment, a duty cycle correction (DCC) circuit is also provided in the second loop to provide a modified signal having close to 50% duty cycle, which facilitates the detection of locks to multiple times periods of the reference signal (noted above). In addition, the second loop contains multiple delay elements operated on the same control signal which determines the delays of the delay elements in the first loop also, and the output of delay elements of the second loop are used to determine any possible locks to multiple time periods of the reference signal.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. DLL Circuit

Figure 5:
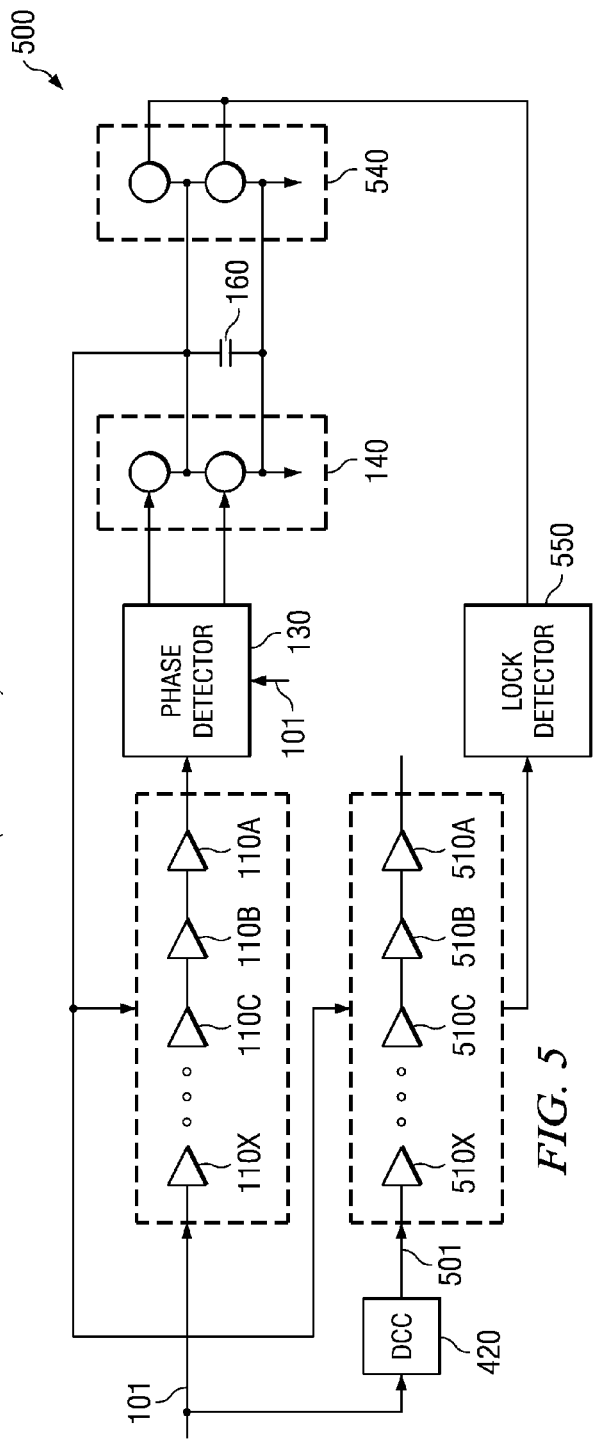
FIG. 5 is a block diagram illustrating the details of a DLL circuit in an embodiment of the present invention.
Figure 4:
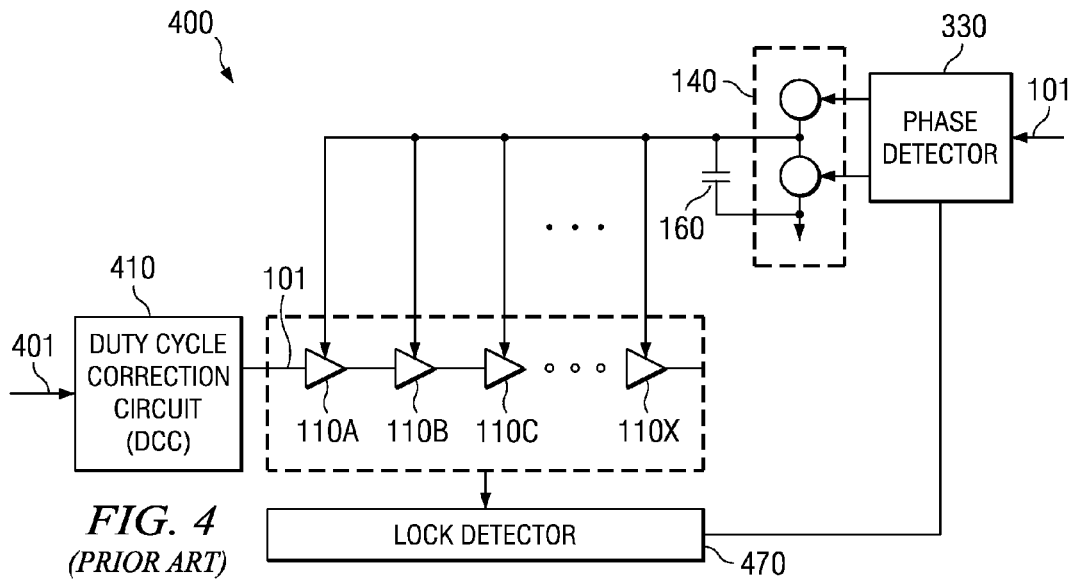
FIG. 4 is a block diagram illustrating the details of a DLL circuit in yet another prior embodiment.

FIG. 5 is a circuit diagram illustrating the details of a DLL circuit in an embodiment of the present invention. Again, for conciseness, the elements already described are shown being used in this circuit as well. DLL circuit 500 is shown containing delay elements 110A-110X and 510A-510X, duty cycle correction (DCC) circuit 420, lock detect circuit 550, phase detect circuit 130, charge pumps 140 and 540, and capacitor 160. Each component is described below in further detail.

Figure 1:
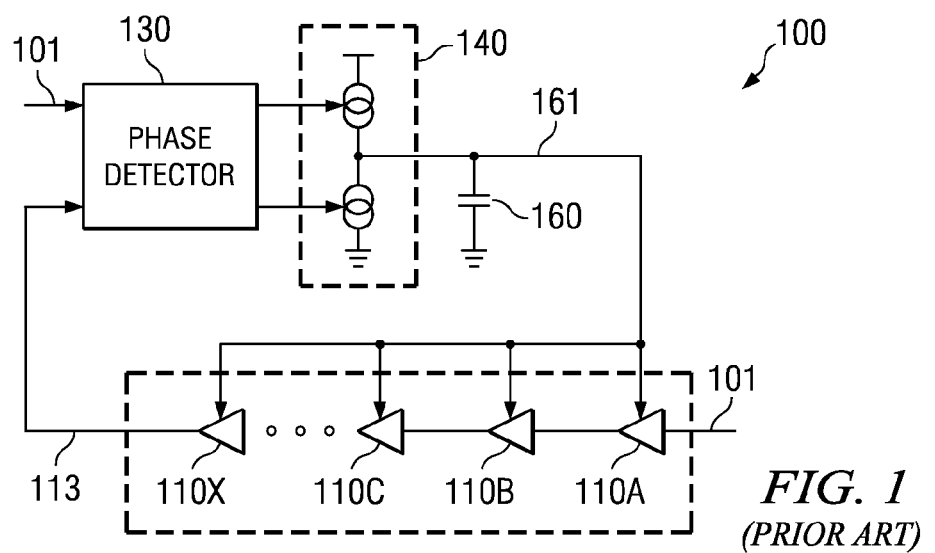
FIG. 1 is a block diagram illustrating the details of a delay locked loop (DLL) circuit in one prior embodiment.
Figure 3:
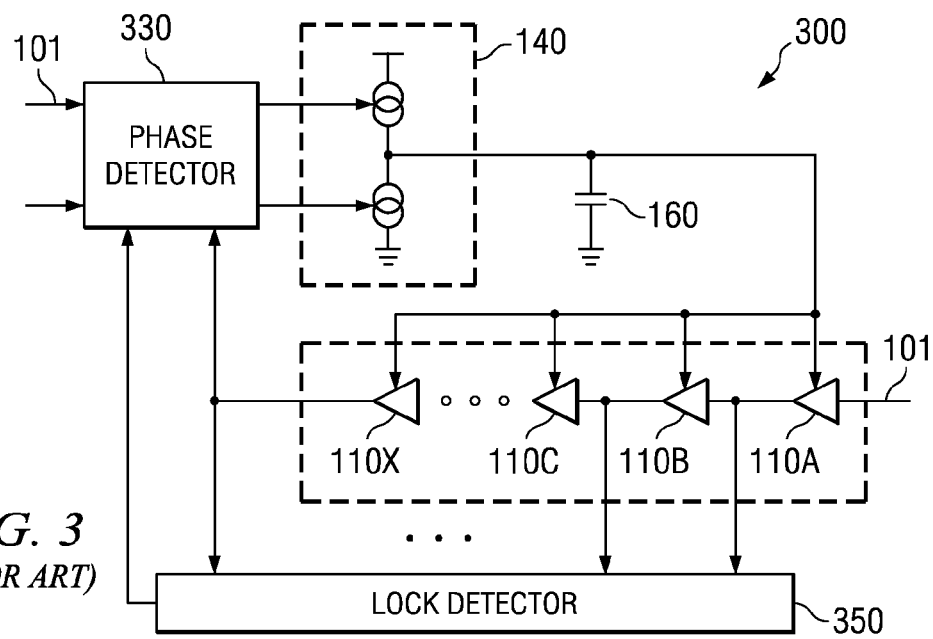
FIG. 3 is a block diagram illustrating the details of a DLL circuit in another prior embodiment.
Figure 2:
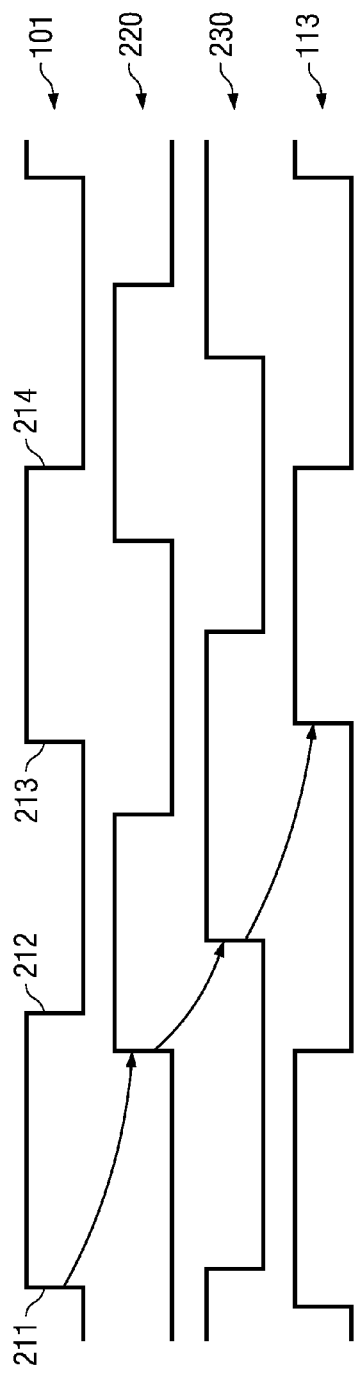
FIG. 2 is a timing diagram illustrating the details of operation of a DLL circuit in one prior embodiment.

Delay elements 110A-110X, phase detector 130, charge pump 140, and capacitor 160 forms a first loop which operate, as described above with respect to FIGS. 1 and 2 above. As may be appreciated, the output signals of delay elements 110A-110X represent the delay signals sought to be generated, and the magnitude of delay is controlled by the voltage level on capacitor 160. The second control loop containing delay elements 510A-510X, duty cycle correction 420, lock detect circuit 550 and charge pump 540 together operate to control the voltage level according to various aspects of the present invention, as described below in further detail.

DCC circuit 420 generates a modified signal 501 having a duty cycle substantially equaling 50% from reference signal 101 (which may potentially have a duty cycle substantially deviating from 50%). The duty cycle of close to 50% ensures that lock detect circuit 550 would more reliably detect situations in which the total delay (of delay elements 110A-110X) is approaching multiple times the period of reference signal 101.

Delay elements 510A-510X receive modified signal 501 and generates dummy signals with delays also determined by the voltage level across capacitor 160. Since delay elements 510A-510X and 110A-110X are operated using the same voltage level, the delays provided by each element may substantially be equal.

Lock detect 550 examines at least some of the dummy signals to determine whether the total delay caused by delay elements 510A-510X (and thus 110A-110X) either exceeds an upper threshold or is below a lower threshold. In case the total delay exceeds the upper threshold, lock detect 550 causes charge pump 540 to vary the charge on capacitor 160 to decrease the magnitude of delay introduced by each delay element. This avoids (approach towards) false locks to multiples of the time period of the reference signal.

On the other hand, if the total delay is below a lower threshold, lock detect 550 causes charge pump 540 to vary the charge on capacitor 160 to increase the magnitude of the delay introduced by each delay element. This approach avoids attempts to lock towards 0 time delay. Lock detect 550 may continue controlling the voltage until the total delay is between the upper threshold and the lower threshold.

Charge pump 540 is implemented with a higher strength than charge pump 140 such that the control from the second loop dominates the charging or discharging of capacitor 160 when the total delay caused by elements 510A-510X is not within the range defined by the upper and lower thresholds. Charge pump 540 may be implemented as a combination of current source and a sink, in a known way.

From the above, it may be appreciated that the components of the second loop are not in the signal path (i.e., in the path generating the desired delay signals from the reference signals), and thus the throughput performance of the DLL circuit is not impacted by the objectives sought to be attained by the second loop. In addition, due to the use of the second control loop, delay signals can be generated from the reference signals of any duty cycle. Furthermore, introduction of additional jitter is avoided in the signal path since DCC is outside the signal path.

The description is continued with respect to the manner in which lock detect circuit needs to generally operate.

3. Lock Detect Mechanism

Figure 6A:
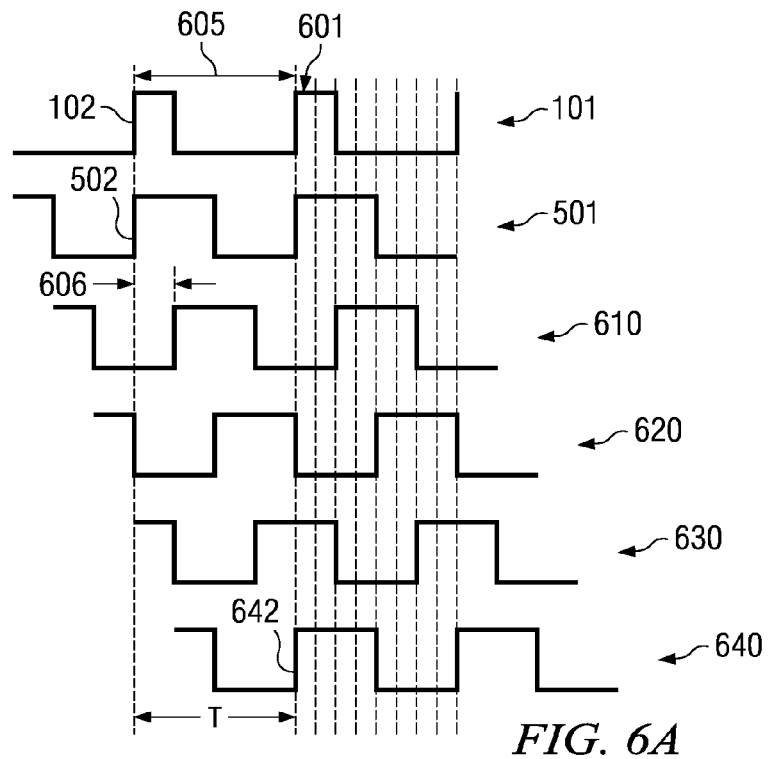
FIG. 6 is a timing diagram illustrating the operation of a lock detect logic in one embodiment.
Figure 6B:
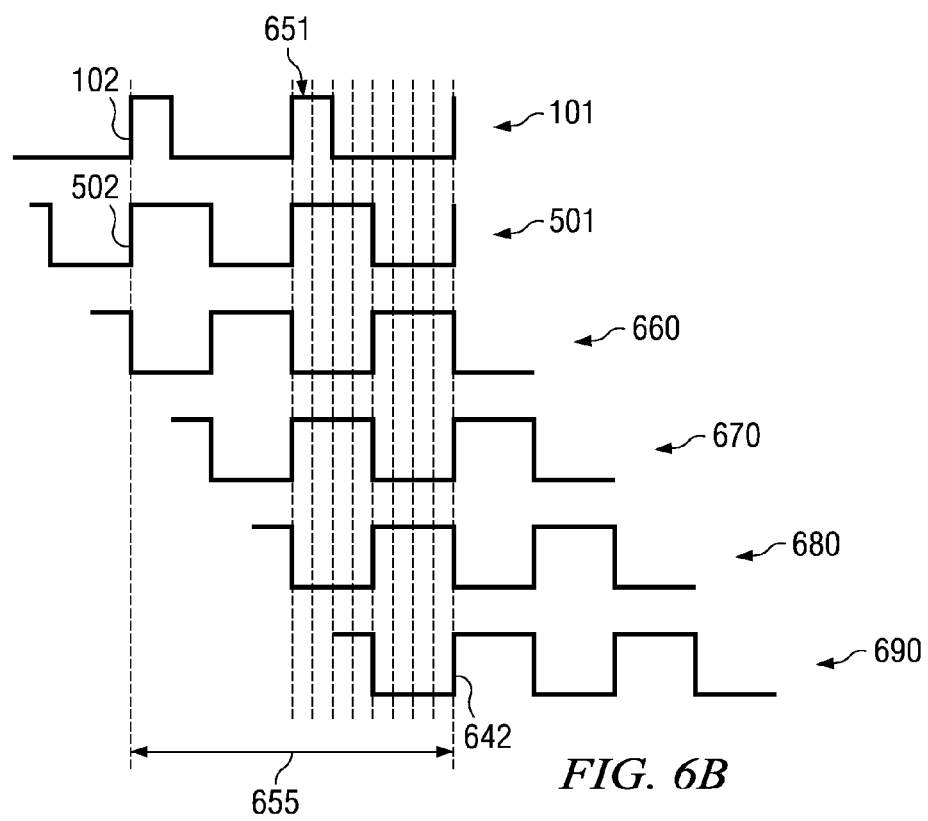

FIGS. 6A and 6B are timing diagrams which together illustrate the manner in which DLL circuits detects situations in which the total delay is exceeding a pre-specified threshold value. In particular, FIG. 6A depicts the timing relationships when the total delay equals the time period (T) of the reference signal, and FIG. 6B depicts the timing relationships when the total delay equals twice the time period T (605). Each Figure is described below in further detail.

The timing diagram of FIG. 6A is shown containing reference signal 101, modified signal 501 and dummy signals 510, 520, 530 and 540. Reference signal 101 is shown with a small duty cycle and DCC 420 converts such a signal into a modified signal 501 having 50% duty cycle. Signal 510 is shown phase shifted by ¼ T (606) assuming only four delay elements are used. The rising edge 642 of signal 640 is shown occurring synchronously with the rising edge of modified signal 501, but with a delay of T, as desired.

It may be appreciated that the logical values of signals 610, 620, 630 and 640 respectively represent values of 0, 0, 1 and 1 at time point 601. The pattern may be used as a confirmation that the delay elements are operating with the correct desired delay.

On the other hand, in case of FIG. 6B, at time point 651 (similar to time point 601 of FIG. 6A), the logical values of signals 660, 670, 680 and 690 are at 0, 1, 0, 1 respectively. Thus, even if the rising edges of signal 501 and 690 are synchronous, the logical values of signals 660, 670, 680 and 690 can be examined to determine that the time delay is 2 times the time period T (shown as 655).

In general, having more delay signals provides more information on the relative delay of the signals. In one embodiment, a total of 36 delay signals are generated. The output of 13th and 8th delay elements respectively cover the delay ranges of 1.38 T-2.76 T and 2.25 T-4.5 T. Similarly, the timing of these signals can be analyzed to determine various delay ranges. For further details on the approaches, the reader is referred to the Foley document referred to above.

The DLL circuits thus described can be used in various components. In one embodiment, the DLL circuit is used within an ADC, as described below in further detail.

4. ADC

Figure 7:
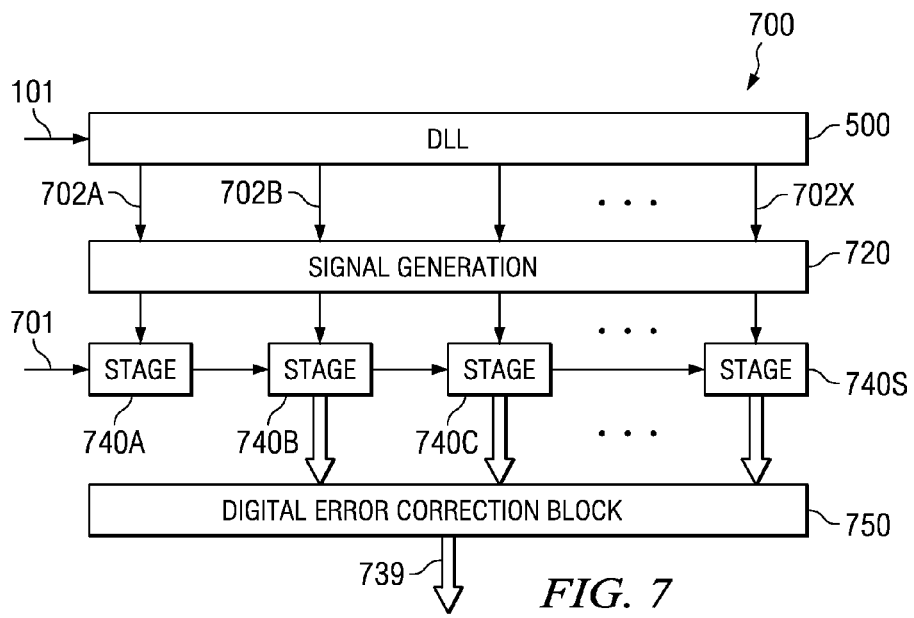
FIG. 7 is a block diagram illustrating the details of implementation of an ADC in one embodiment.

FIG. 7 is a block diagram of an ADC illustrating the manner in which DLL circuits implemented according to the features described above can be used in various components. ADC 700 is shown containing DLL 500, signal generator 720, stages 740A-740S, and correction block 750. Each block is described in further detail below.

DLL 500 is shown receiving a reference signal 701 (generated, for example, by an oscillator, not shown) and generating delayed signals 702A-702X. Signal generator 720 generates a sampling signal and a hold signal (which respectively define the time instances/duration in which each stage samples the output from a prior stage and amplifies/holds a residue signal) using delayed signals 720A-720X. In general, the edges of the sampling and hold signals are determined by the edges of delayed signals 702A-702X. Signal generator 720 may be implemented using one of several known techniques.

Each stage 740A-740S receives an input signal and generates a sub-code representing the voltage level of the input signal. The stage also amplifies a residue signal representing a difference of (Vi–Veq), wherein Veq represents the voltage equivalent of the sub-code generated by the sub-stage, and the amplified residue signal is provided as an input to the next stage. Correction block 750 receives the sub-codes from the stages and generates a corrected digital code (on path 739) representing the voltage level of a sample on the input signal received by the first stage 740A.

The ADCs thus designed can be implemented in various devices. An example device is described below in further detail.

5. Device

Figure 8:
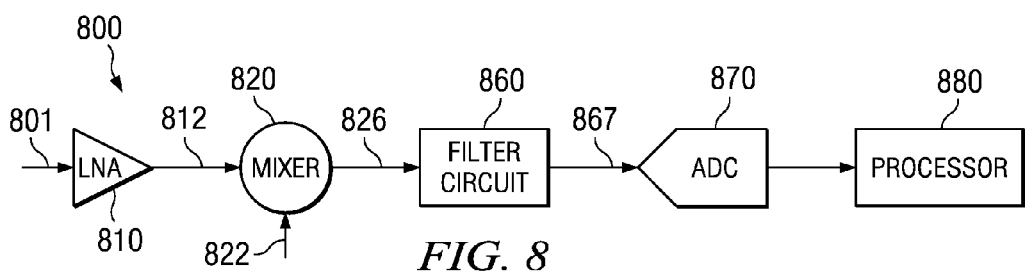
FIG. 8 is a block diagram of receiver system illustrating an example system in which various aspects of the present invention may be implemented.

FIG. 8 is a block diagram of receiver system 800 illustrating an example system in which various aspects of the present invention may be implemented. For illustration, it is assumed that receiver system 800 is implemented within a wireless receiver. However, receiver system 800 can be implemented in other devices (wireless as well as wire-based communications) as well.

Receiver system 800 is shown containing low noise amplifiers (LNA) 810, mixer 820, filter circuit 860, analog to digital converter (ADC) 870, and processor 880. Each block/stage is described in further detail below.

LNA 810 receives signals on path 801 and amplifies the received signals to generate a corresponding amplified signal on path 812. For example, in wireless systems, the signals that are transmitted from satellites, etc. may be received by an antenna (not shown) and the received signals are provided on path 801. The received signals may be weak in strength and thus amplified by LNA 810 for further processing. LNA 810 may be implemented in a known way.

Mixer 820 may be used to down-convert the received amplified signal on path 812 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 820 may receive the amplified signal on path 812 and a signal of fixed frequency on path 822 as inputs, and provides the intermediate signal on path 826. The signal of fixed frequency on path 822 may be generated by a phase locked loop (not shown) in a known way.

Filter circuit 860 may correspond to a low pass filter, which allows the desired low frequencies and rejects all other unwanted high frequencies present in the signal received on line 826. The filtered signal, which contains the frequency band of interest, is provided on path 867.

ADC 870 converts (samples) the filtered signal received on path 867 to a corresponding digital value, which represents the signal of interest in received signal 801. Processor 880 processes the received digital values to provide various user applications and may be implemented as multiple processing units, each potentially operating independently. ADC 870 may be implemented using various features described in sections above.

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A delay locked loop (DLL) circuit generating a plurality of delayed signals from a reference signal, each of said plurality of delayed signals being delayed by a corresponding different delay magnitude in comparison to said reference signal, said DLL circuit comprising:

a first plurality of delay elements connected in series, said first plurality of delay elements receiving said reference signal and generating said plurality of delayed signals on corresponding first plurality of output paths based on a strength of a control signal;

a first control loop controlling said strength of said control signal to cause synchronization of edges of said reference signal with edges of the output of a last one of said first plurality of delay elements, said first control loop containing said first plurality of delay elements; and a second control loop also controlling said strength of said control signal to avoid synchronization of edges of the output of the last one of said plurality of delay elements with edges separated by multiple time periods of said reference signal, wherein said second control loop comprises a second plurality of delay elements generating a corresponding plurality of dummy signals, and wherein the plurality of delayed signals pass through at least some of the first plurality of delay elements and wherein the plurality of delayed signals do not pass through the second plurality of delay elements.

2. A delay locked loop (DLL) circuit generating a plurality of delayed signals from a reference signal, each of said plurality of delayed signals being delayed by a corresponding different delay magnitude in comparison to said reference signal, said DLL circuit comprising:
   a first plurality of delay elements connected in series, said first plurality of delay elements receiving said reference signal and generating said plurality of delayed signals on corresponding first plurality of output paths based on a strength of a control signal;
   a first control loop controlling said strength of said control signal to cause synchronization of edges of said reference signal with edges of the output of a last one of
   said first plurality of delay elements, said first control loop containing said first plurality of delay elements; and
   a second control loop also controlling said strength of said control signal to avoid situations of synchronization of edges of the output of the last one of said plurality of delay elements with edges separated by multiple time periods of said reference signal;
   wherein said second control loop comprises a second plurality of delay elements generating a corresponding plurality of dummy signals, wherein said plurality of delayed signals do not pass through the second plurality of delay elements; and
   wherein said second control loop performs said avoiding by determining situations in which a total delay caused by said first plurality of delay elements has crossed an upper threshold.

3. The DLL circuit of claim 2, wherein said upper threshold equals 1.3 times a time period of said reference signal.

4. The DLL circuit of claim 3, wherein said second control loop also checks whether said total delay is lower than a lower threshold and control said strength to cause said total delay to further increase.

5. The DLL circuit of claim 4, wherein said lower threshold equals 0.7 times of said time period of said reference signal.

6. The DLL circuit of claim 5, wherein said determining and said checking are performed by examining said plurality of dummy signals.

7. A delay locked loop (DLL) circuit generating a plurality of delayed signals from a reference signal, each of said plurality of delayed signals being delayed by a corresponding different delay magnitude in comparison to said reference signal, said DLL circuit comprising:
   a first plurality of delay elements connected in series, said first plurality of delay elements receiving said reference signal and generating said plurality of delayed signals on corresponding first plurality of output paths;
   a duty cycle correction circuit generating a modified signal from said reference signal, said modified signal having a duty cycle different from the duty cycle of said reference signal if the duty cycle of said reference signal is not close to 50%;
   a phase detector comparing a phase of said reference signal and the delayed signal on an output path of a last one of said first plurality of delay elements, and controlling a magnitude of delay caused by each of said first plurality of delay elements at least until edges of said reference signal and the delayed signal are synchronized;
   a second plurality of delay elements also connected in series and receiving said modified signal, said second plurality of delay elements generating a plurality of dummy signals on corresponding second plurality of output paths, wherein a signal path between the reference signal and the delayed signal on said output path does not pass through the second plurality of delay elements; and
   a lock detector determining whether a total delay caused by said first plurality of delay elements is more than an upper threshold by examining at least some of said plurality of dummy signals, said lock detector causing said magnitude of said delay to be further decreased if said total delay is more than said upper threshold even if said phase detector otherwise determines that said edges of said reference signal and the delayed signal are synchronized.

8. The DLL circuit of claim 7, wherein said lock detector determines whether said total delay caused by said first plurality of delay elements is less than a lower threshold by examining said plurality of dummy signals, and causes said first plurality of delay elements to increase said total delay.

9. The DLL circuit of claim 7, wherein said first plurality of delay elements and said second plurality of delay elements receive a same reference voltage which controls the corresponding delay caused.

10. The DLL circuit of claim 9, further comprising:
    a capacitor which provides said same reference voltage;
    a first charge pump charging said capacitor under the control of said phase detector to control said magnitude of delay;
    a second charge pump charging said capacitor under the control of said lock detector to also control said magnitude of delay.

11. The DLL circuit of claim 10, wherein said second charge pump operates to control said magnitude of delay only until said total delay is more than said upper threshold.

12. The DLL circuit of claim 10, wherein each of said first plurality of delay elements introduces equal delay such that Qth one of said plurality of delayed signals is delayed by $(Q*T/X)$, wherein T represents the total time period of said reference signal and X represents the total number of said first plurality of delay elements.

13. The DLL circuit of claim 10, wherein said phase detector causes positive edges of said reference signal to be synchronized with positive edges of the output of said last one of said first plurality of elements.

14. The DLL circuit of claim 10, wherein said upper threshold equals 1.3 times said time period of said reference signal and said lower threshold equals 0.7 times said time period of said reference signal.

* * * * *